(12) United States Patent
Wang et al.

(10) Patent No.: US 11,201,620 B2
(45) Date of Patent: Dec. 14, 2021

(54) POWER SUPPLY CIRCUIT AND APPARATUS

(71) Applicant: HUAWEI TECHNOLOGIES CO., LTD., Guangdong (CN)

(72) Inventors: Guorui Wang, Shanghai (CN); Zheng Li, Shanghai (CN); Chen Wang, Shanghai (CN); Yu Zhu, Shanghai (CN); Zhenming Zhang, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/079,857

(22) Filed: Oct. 26, 2020

(65) Prior Publication Data

US 2021/0044295 A1 Feb. 11, 2021

Related U.S. Application Data

(63) Continuation of application No. PCT/CN2018/084918, filed on Apr. 27, 2018.

(51) Int. Cl.
*H03K 17/687* (2006.01)
*H03K 17/693* (2006.01)
(Continued)

(52) U.S. Cl.
CPC .......... *H03K 17/693* (2013.01); *H01G 9/008* (2013.01); *H03F 3/245* (2013.01); *H03K 17/04106* (2013.01); *H03F 2200/102* (2013.01)

(58) Field of Classification Search
CPC ............ H03K 17/04; H03K 17/04106; H03K 17/04113; H03K 17/042; H03K 17/04206;
(Continued)

(56) References Cited

U.S. PATENT DOCUMENTS 6,256,215 B1 7/2001 Barrett et al.
2010/0289560 A1* 11/2010 Mavencamp ........ H03K 17/063
327/538

(Continued)

FOREIGN PATENT DOCUMENTS

CN 101320149 A 12/2008
CN 101872208 A 10/2010
(Continued)

*Primary Examiner* — Long Nguyen
(74) *Attorney, Agent, or Firm* — Womble Bond Dickinson (US) LLP

(57) ABSTRACT

A power supply circuit and an apparatus includes: a first switching transistor, a second switching transistor, a third switching transistor, a fourth switching transistor, a first capacitor, and a second capacitor. In this power supply circuit, one terminal of the first capacitor is connected to one terminal of the second capacitor, the other terminal of the first capacitor is separately connected to a first electrode of the first switching transistor and a first electrode of the second switching transistor, a second electrode of the first switching transistor is connected to a second electrode of the third switching transistor, a second electrode of the second switching transistor is connected to a second electrode of the fourth switching transistor, a third electrode of the first switching transistor is connected to an output node, and a third electrode of the second switching transistor is grounded.

18 Claims, 2 Drawing Sheets

(51) Int. Cl.
  *H01G 9/008* (2006.01)
  *H03F 3/24* (2006.01)
  *H03K 17/041* (2006.01)

(58) Field of Classification Search
  CPC .......... H03K 17/04213; H03K 17/687; H03K 17/693; H03K 19/01; H03K 19/013; H03K 19/0133; H03K 19/0136; H03K 19/017; H03K 19/01707; H03K 19/01714; H03K 19/01721; H03F 3/20; H03F 3/21; H03F 3/211; H03F 3/24; H03F 3/245; H01G 9/008
  See application file for complete search history.

(56) References Cited

U.S. PATENT DOCUMENTS

2012/0086479 A1* 4/2012 Carpenter ............. H02M 3/158
                                                      327/109
2016/0134279 A1  5/2016 Sicard

FOREIGN PATENT DOCUMENTS

| CN | 102027663 A | 4/2011 |
| CN | 102217179 A | 10/2011 |
| CN | 104539147 A | 4/2015 |
| CN | 106059290 A | 10/2016 |
| CN | 106664020 A | 5/2017 |
| WO | 2017141559 A1 | 8/2017 |

* cited by examiner

POWER SUPPLY CIRCUIT AND APPARATUS

CROSS-REFERENCE TO RELATED APPLICATIONS

This application is a continuation of International Application No. PCT/CN2018/084918, filed on Apr. 27, 2018, the disclosure of which is hereby incorporated by reference in its entirety.

TECHNICAL FIELD

This application relates to the field of electronic technologies, and in particular, to a power supply circuit and an apparatus.

BACKGROUND

To improve utilization of increasingly congested frequency band resources and a data transmission rate in wireless communications, a complex variable envelope modulation scheme is widely used in a new generation wireless communications system, so that a modulation signal has a very high peak-to-average power ratio (PAPR). An envelope tracking (ET) technology may be used to effectively resolve a problem that a power amplifier has low efficiency when a modulation signal with a high PAPR is input, and has a broad application prospect. A core of the ET technology includes the following: extracting an envelope of a radio frequency signal, and using the envelope as a reference for a power supply of a radio frequency power amplifier, so that the power supply of the radio frequency power amplifier changes with the envelope, and the power amplifier can always operate in a saturation region. A tracking bandwidth is a key element of an envelope tracking power supply. If a switching converter has a higher switching frequency, a higher tracking bandwidth of the converter can be implemented. However, due to limitation of performance of a switching component, an excessively high switching frequency increases switching losses and reduces efficiency of the switching converter, and consequently causes low dynamic performance of a circuit system.

SUMMARY

This application provides a power supply circuit and an apparatus, to improve stability of a circuit system and dynamic performance of the circuit system.

According to a first aspect, an embodiment of this application provides a circuit, where the circuit includes a plurality of channels, and at least one channel or each channel of the plurality of channels includes a first switching transistor, a second switching transistor, a third switching transistor, a fourth switching transistor, a first capacitor, and a second capacitor; one terminal of the first capacitor is connected to one terminal of the second capacitor, the other terminal of the first capacitor is connected to each of a first electrode of the first switching transistor and a first electrode of the second switching transistor, a second electrode of the first switching transistor is connected to a second electrode of the third switching transistor, a second electrode of the second switching transistor is connected to a second electrode of the fourth switching transistor, a third electrode of the first switching transistor is connected to an output node, and a third electrode of the second switching transistor is grounded. Charging charges of the second capacitor are balanced by using an ideal charge storage capacity of the first capacitor. This improves stability of a circuit system and dynamic performance of the circuit system.

In an embodiment, when the third switching transistor M1 is turned off and the fourth switching transistor M2 is turned on, a lower plate of the second capacitor C1 is connected to a voltage source source of lowside VSSL. Drive signals that are input at the second electrode of the first switching transistor M1' and the second electrode of the third switching transistor M1 are the same, and drive signals that are input at the second electrode of the second switching transistor M2' and the second electrode of the fourth switching transistor M2. Therefore, the first switching transistor M1' is turned off, the second switching transistor M2' is turned on, and a lower plate of the first capacitor C1' is connected to the voltage source source of lowside. In this case, both the first capacitor C1' and the second capacitor C1 are connected to the voltage source source of lowside.

In another embodiment, when the third switching transistor M1 is turned on and the fourth switching transistor M2 is turned off, a lower plate of the second capacitor C1 is connected to the output node VSSH, and a potential of the lower plate of the second capacitor C1 is equal to a potential of a VDD. Drive signals that are input at the second electrode of the first switching transistor M1' and the second electrode of the third switching transistor M1 are the same, and drive signals that are input at the second electrode of the second switching transistor MT and the second electrode of the fourth switching transistor M2. Therefore, the first switching transistor M1' is turned on, the second switching transistor M2' is turned off, a lower plate of the first capacitor C1' is connected to the output node VSSH, a potential of the lower plate is also equal to the potential of the VDD, and the potentials of the lower plates of the first capacitor C1' and the second capacitor C1 are equal.

Through analysis of the foregoing two cases, when there are insufficient or excessive charging charges of the capacitor C1, the ideal charge storage capacity of the first capacitor C1' may be used to balance the charging charges of the second capacitor C1. In this way, when the third switching transistor M1 is turned off and the fourth switching transistor M2 is turned on, a potential of the output node VSSH does not deviate from a potential of the voltage source source of lowside VSSL. Alternatively, when the third switching transistor M1 is turned on and the fourth switching transistor M2 is turned off, a potential of the output node VSSH does not deviate from the potential of the VDD, to avoid voltage fluctuation and provide a buffer function for the second capacitor C1.

In another embodiment, a type of the first switching transistor M1' is the same as a type of the third switching transistor M1, to ensure that the first switching transistor M1' and the third switching transistor M1 are both turned off or turned on when a same drive signal is input. Similarly, a type of the second switching transistor M2' is the same as a type of the fourth switching transistor M2, to ensure that the second switching transistor M2' and the fourth switching transistor M2 are both turned off or turned on when a same drive signal is input.

In another embodiment, a size of the first switching transistor M1' is X times a size of the third switching transistor M1, a size of the second switching transistor M2' is Y times a size of the fourth switching transistor M2, and both X and Y are greater than 1. Because a larger size of a switching transistor indicates smaller impedance and a better heat dissipation effect, a first switching transistor M1' and a second switching transistor M2' of sizes as large as possible can be selected.

In another embodiment, the first switching transistor M1' and the second switching transistor M2' are selected based on an actual signal frequency. Because a smaller signal frequency indicates larger impedance, a first switching transistor M1' of a relatively large size and a second switching transistor MT of a relatively large size can be selected. Because a larger signal frequency indicates smaller impedance, a first switching transistor M1' of a relatively small size and a second switching transistor M2' of a relatively small size can be selected.

In another embodiment, the first switching transistor M1', the second switching transistor M2', the third switching transistor M1, or the fourth switching transistor M2 includes but is not limited to a bipolar transistor, a metal-oxide semiconductor field-effect transistor, or various III-V compound semiconductors.

In another embodiment, the first capacitor C1' or the second capacitor C1 may include but is not limited to a ceramic capacitor, a tantalum capacitor, or an electrolytic capacitor.

In another embodiment, the power supply circuit is a multi-phase modulation power supply circuit.

According to a second aspect, an embodiment of this application discloses a power supply circuit, where the circuit includes a plurality of channels, and each channel or at least one channel of the plurality of channels includes a first switching transistor, a second switching transistor, a first capacitor, and a power supply chip, the power supply chip includes a third switching transistor, a fourth switching transistor, and a second capacitor; one terminal of the first capacitor is connected to one terminal of the second capacitor, the other terminal of the first capacitor is connected to each of a first electrode of the first switching transistor and a first electrode of the second switching transistor, a second electrode of the first switching transistor is connected to a second electrode of the third switching transistor, a second electrode of the second switching transistor is connected to a second electrode of the fourth switching transistor, a third electrode of the first switching transistor is connected to an output node, and a third electrode of the second switching transistor is grounded. Charging charges of the second capacitor are balanced by using an ideal charge storage capacity of the first capacitor. This improves stability of a circuit system and dynamic performance of the circuit system.

In an embodiment, the first capacitor C ' may be disposed inside the power supply chip, thereby facilitating integration of the power supply chip and reducing power consumption of the circuit. Alternatively, the first capacitor C1' may be disposed outside the power supply chip, thereby facilitating selection of a capacitor with a larger capacitance, and achieving a better effect of improving stability of the circuit. The first capacitor C1' may be disposed adjacent to the second capacitor. In addition, the first switching transistor M1' and the second switching transistor M2' may be disposed outside the power supply chip, or may be disposed inside the power supply chip.

According to a third aspect, an embodiment of this application provides an apparatus, where the apparatus includes either of the power supply circuits provided in the first aspect and the second aspect.

BRIEF DESCRIPTION OF DRAWINGS

To describe the technical solutions in the embodiments of this application or in the background more clearly, the following briefly describes the accompanying drawings for describing the embodiments of this application or the background.

DESCRIPTION OF EMBODIMENTS

The following describes the embodiments of this application with reference to the accompanying drawings in the embodiments of this application.

Figure 1:
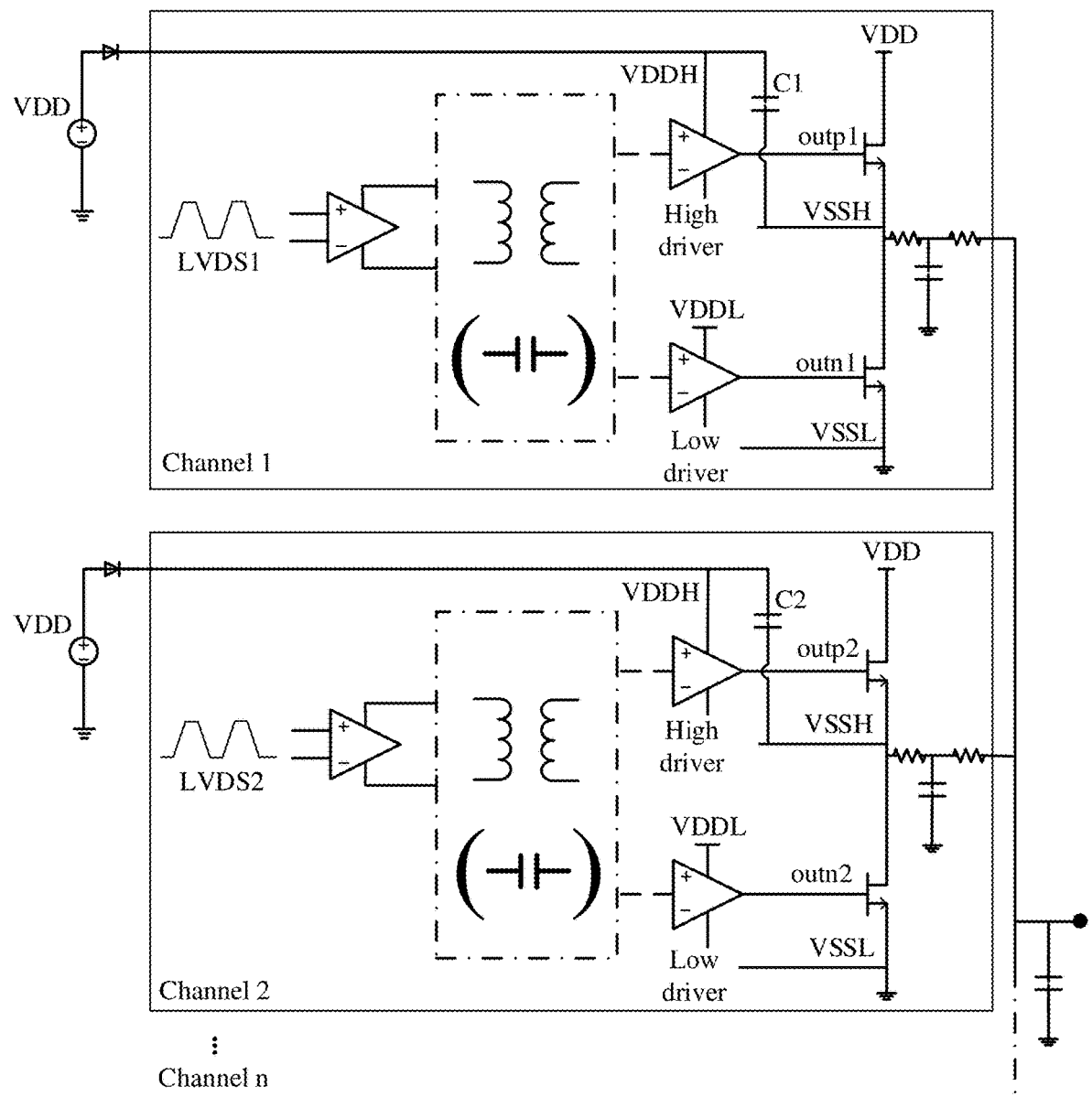
FIG. 1 is a schematic structural diagram of a power supply circuit according to an embodiment of this application.

FIG. 1 is a schematic structural diagram of a power supply circuit according to an embodiment of this application. The power supply circuit is a multi-phase modulation power supply circuit. The power supply circuit includes a plurality of channels. Each channel or at least one channel of the plurality of channels includes two switching transistors and one capacitor. The two switching transistors include an upper switching transistor and a lower switching transistor. The capacitor may be a common capacitor, and may also be referred to as a bootstrap capacitor (C1 on a channel 1 and C2 on a channel 2 that are shown in FIG. 1). The bootstrap capacitor is actually a positive feedback capacitor, and is used to boost up a voltage. Due to a characteristic that voltages at two terminals (a positive terminal and a negative terminal) of a capacitor cannot change suddenly, when specific voltages are maintained at the two terminals of the capacitor, the voltage at the negative terminal of the capacitor is boosted up. Because an original voltage difference between the positive terminal and the negative terminal is still maintained, it is equivalent to that the voltage at the positive terminal is boosted up by the negative terminal. In addition, each channel further includes drivers (a high driver high driver and a low driver low driver that are shown in FIG. 1) and a transformer. The high driver is connected to a voltage drain drain of highside (VDDH), and the low driver is connected to a voltage drain drain of lowside (VDDL). The first low voltage differential signal (LVDS1) is input on the first channel, and the second low voltage differential signal (LVDS2) is input on the second channel.

In the circuit structure shown in FIG. 1, a same controller may be used to control all channels. Theoretically, steady-state duty cycles of all the channels are consistent, but a phase shift of 360/N exists between control signals on all the channels, where N is a positive integer greater than or equal to 1. Each channel is a switching-mode buck converter circuit. If a switching frequency of a single-phase buck circuit is fs, an equivalent switching frequency of a multi-phase buck circuit is N*fs. Therefore, a relatively high equivalent switching frequency can be obtained by using the multi-phase buck circuit without increasing a single-phase switching frequency. Because there is a phase difference between the buck circuits of all phases, ripples of output currents of the buck circuits of all the phases can offset each other to an extent, thereby reducing an output capacitance. The multi-phase modulation power supply circuit has a structure commonly used in an envelope tracking power supply solution. When a switching frequency of each channel remains unchanged, the multi-phase modulation power supply circuit can be used to not only improve a switching frequency of a switching converter, but also improve efficiency of the switching converter.

However, because a voltage difference between two terminals of the bootstrap capacitor on each channel in the multi-phase modulation power supply circuit is unstable, dynamic performance of a system is affected, including the following: First, in some application scenarios (such as a broadband signal, a high-load time period, or an input signal with a high duty cycle), the voltage difference (namely, a supply voltage of the high driver on each channel) between the two terminals of the bootstrap capacitor on each channel is unstable, and consequently a surge or a sag occurs in an output current of an inductor and an output envelope voltage. Second, when a voltage difference between two terminals of a bootstrap capacitor on a channel exceeds a first threshold, overvoltage may occur in a gate-source voltage (Vgs) of an upper switching transistor on the channel, and when the voltage difference between the two terminals of the bootstrap capacitor exceeds a maximum allowed voltage range, permanent damage may be caused to the switching transistor. Alternatively, when a voltage difference between two terminals of a bootstrap capacitor on a channel is less than a second threshold, an upper switching transistor on the channel may not be fully turned on, and an on-resistance is relatively large. Consequently, overall system efficiency is reduced, and the switching transistor is overheated.

For the foregoing problem of the multi-phase modulation power supply circuit in an actual application, a capacitance of the bootstrap capacitor on each channel may be increased for improvement. However, the following problems still exist: First, increasing the capacitance of the bootstrap capacitor can only slow down a change speed and amplitude of the voltage difference between the two terminals of the bootstrap capacitor, but cannot change a change trend of the voltage difference. When duration of an input signal with a high duty cycle is several microseconds or more, an improvement extent is very limited. Second, for a high-frequency driver or an ET power supply chip, a filter capacitor and a bootstrap capacitor are generally sealed, to minimize a parasitic impact as much as possible. Due to limitation of an encapsulation technology and costs, integration of a large-capacitance and large-volume capacitor is difficult to implement.

In conclusion, the foregoing problems are caused by the unstable voltage difference between the two terminals of the bootstrap capacitor. Main reasons for the foregoing problems include the following: There is a phase difference between input signals or output signals on all the channels, and output nodes on all the channels are mutually fed through by using an LC oscillator circuit. For example, the output node is a voltage source source of highside (VSSH) shown in FIG. 1. As a result, a voltage of an output node on a channel is unstable at a moment before an upper switching transistor on the channel is turned on. Consequently, a charging voltage of a bootstrap capacitor on the channel cannot reach an ideal preset value, and a voltage difference between two terminals of the bootstrap capacitor is greater than or less than the ideal preset value after the bootstrap capacitor is boosted up, and gradually changes as an impact caused by mutual feed-through between all the channels accumulates in each period. When a duty cycle of an input signal in a short time period is maintained at a relatively large value, the accumulation of the impact caused by mutual feed-through is severer. Therefore, increasing the capacitance of the bootstrap capacitor on each channel can only alleviate an effect of the impact caused by mutual feed-through, but cannot fundamentally resolve the foregoing problems.

Figure 2:
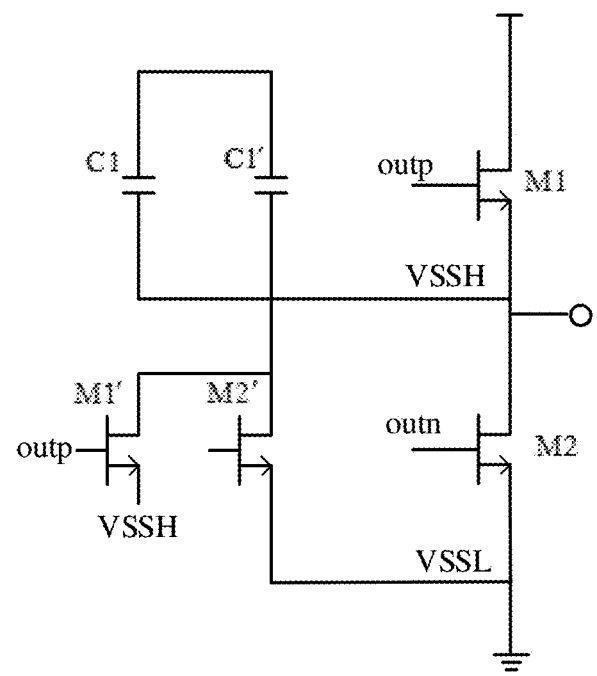
FIG. 2 is a schematic structural diagram of another power supply circuit according to an embodiment of this application.

FIG. 2 is a schematic structural diagram of another power supply circuit according to an embodiment of this application. The power supply circuit is a multi-phase modulation power supply circuit. The power supply circuit includes a plurality of channels. FIG. 2 shows only one channel of the power supply circuit, and shows only some elements on the channel. At least one channel or each channel of the plurality of channels may include a first switching transistor M1', a second switching transistor M2', a third switching transistor M1, a fourth switching transistor M2, a first capacitor C1', and a second capacitor C1. The second capacitor C1 may be referred to as a bootstrap capacitor. One terminal of the first capacitor C1' is connected to one terminal of the second capacitor C1. The other terminal of the first capacitor C1' is connected to each of a first electrode of the first switching transistor M1' and a first electrode of the second switching transistor M2'. A second electrode of the first switching transistor M1' is connected to a second electrode of the third switching transistor M1 (two same outps in the figure indicate a connection relationship). A second electrode of the second switching transistor M2' is connected to a second electrode of the fourth switching transistor M2 (two same outns in the figure indicate a connection relationship). A third electrode of the first switching transistor M1' is connected to an output node VSSH (two VSSHs in the figure indicate a same output node). A third electrode of the second switching transistor is grounded, for example, is connected to a voltage source source of lowside (VSSL) shown in FIG. 2.

In another embodiment, the power supply circuit includes a plurality of channels. Each channel or at least one channel of the plurality of channels includes a first switching transistor, a second switching transistor, a first capacitor, and a power supply chip. The power supply chip includes a third switching transistor, a fourth switching transistor, and a second capacitor. A connection manner of each element is the same as the connection manner shown in FIG. 2.

Figure 3:
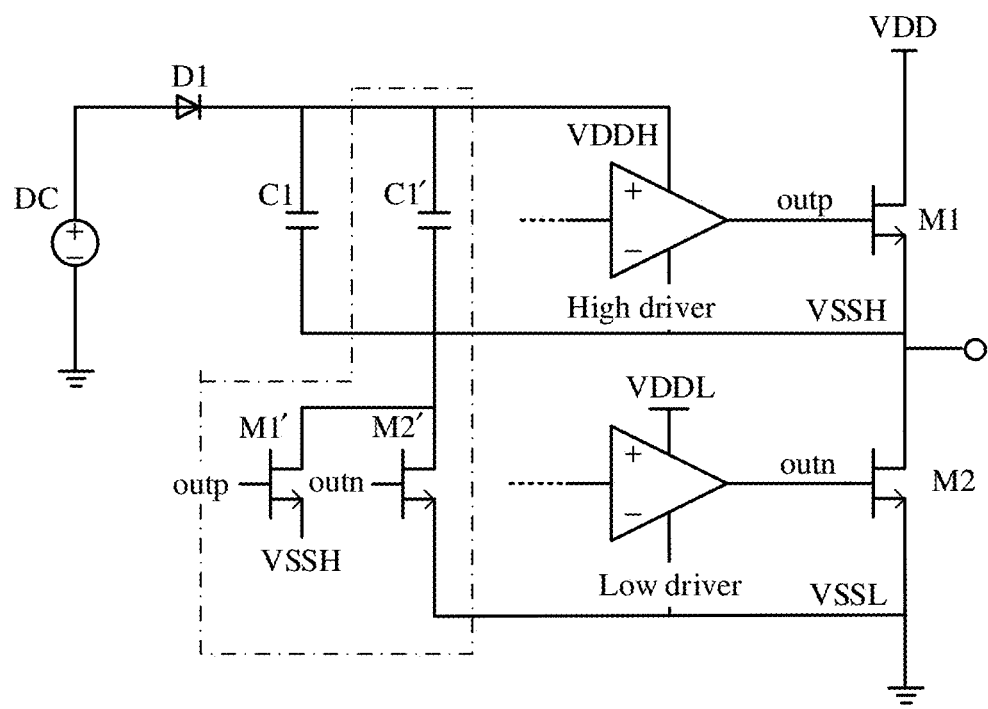
FIG. 3 is a schematic structural diagram of still another power supply circuit according to an embodiment of this application.

FIG. 3 is a schematic structural diagram of still another power supply circuit according to an embodiment of this application. FIG. 3 also shows only one channel of the multi-phase modulation power supply circuit, and shows only some elements on the channel. A power supply chip includes a power supply DC, a diode Dl, a second capacitor C1, a first driver, a second driver, a third switching transistor M1, and a fourth switching transistor M2. The power supply circuit in this embodiment of the present application is improved on a basis of the power supply chip, where a first capacitor C1', a first switching transistor M1', and a second switching transistor M2' are added. A second electrode of the first switching transistor M1' and a second electrode of the third switching transistor M1 each may be a gate of a MOS transistor or a base of a transistor. Correspondingly, a first electrode may be a source of the MOS transistor or a collector of the transistor, and a third electrode may be a drain of the MOS transistor or an emitter of the transistor. Drive signals that are input at the second electrode of the first switching transistor M1' and the second electrode of the third switching transistor M1 are the same. A second electrode of the second switching transistor MT and a second electrode of the fourth switching transistor M2 each may be a gate of a MOS transistor or a base of a transistor. Correspondingly, a first electrode may be a source of the MOS transistor or a collector of the transistor, and a third electrode may be a drain of the MOS transistor or an emitter of the transistor. Drive signals that are input at the second electrode of the second switching transistor MT and the second electrode of the fourth switching transistor M2 are the same.

It should be understood that a working principle of the power supply circuit is as follows: When the third switching transistor M1 is turned off and the fourth switching transistor M2 is turned on, a lower plate of the second capacitor C1 is connected to a voltage source source of lowside (VSSL). The drive signals that are input at the second electrode of the first switching transistor M1' and the second electrode of the third switching transistor M1 are the same, and the drive signals that are input at the second electrode of the second switching transistor M2' and the second electrode of the fourth switching transistor M2. Therefore, the first switching transistor M1' is turned off, the second switching transistor M2' is turned on, and a lower plate of the first capacitor C1' is connected to the voltage source source of lowside (VSSL). In this case, both the first capacitor C1' and the second capacitor C1 are connected to the voltage source source of lowside (VSSL). When the third switching transistor M1 is turned on and the fourth switching transistor M2 is turned off, a lower plate of the second capacitor C1 is connected to an output node VSSH, and a potential of the lower plate of the second capacitor C1 is equal to a potential of a voltage drain drain (VDD). The drive signals that are input at the second electrode of the first switching transistor M1' and the second electrode of the third switching transistor M1 are the same, and the drive signals that are input at the second electrode of the second switching transistor MT and the second electrode of the fourth switching transistor M2. Therefore, the first switching transistor M1' is turned on, the second switching transistor MT is turned off, a lower plate of the first capacitor C1' is connected to the output node VSSH, a potential of the lower plate is also equal to the potential of the VDD, and the potentials of the lower plates of the first capacitor C1' and the second capacitor C1 are equal. Through analysis of the foregoing two cases, when there are insufficient or excessive charging charges of the capacitor C1, an ideal charge storage capacity of the first capacitor C1' may be used to balance the charging charges of the second capacitor C1. In this way, when the third switching transistor M1 is turned off and the fourth switching transistor M2 is turned on, a potential of the output node VSSH does not deviate from a potential of the voltage source source of lowside (VSSL). Alternatively, when the third switching transistor M1 is turned on and the fourth switching transistor M2 is turned off, a potential of the output node VSSH does not deviate from the potential of the VDD, to avoid voltage fluctuation and provide a buffer function for the second capacitor C1.

In an embodiment, a capacitance of the first capacitor C1' is N times a capacitance of the second capacitor C1, and N is greater than 1. For example, C1=100 nF, C1'=2.2 uF, and N=22. If the first capacitor C1' is larger, a charge storage capacity is larger, and fluctuation of a voltage difference between two terminals of the second capacitor C1 imposes less impact on the circuit. Therefore, a second capacitor with a capacitance as large as possible can be selected. In addition, the second capacitor may be selected based on an actual signal frequency. If a signal frequency is small, a second capacitor with a relatively large capacitance may be selected. If a signal frequency is large, a second capacitor with a relatively small capacitance may be selected.

In an embodiment, a type of the first switching transistor M1' is the same as a type of the third switching transistor M1, to ensure that the first switching transistor M1' and the third switching transistor M1 are both turned off or turned on when a same drive signal is input. Similarly, a type of the second switching transistor M2' is the same as a type of the fourth switching transistor M2, to ensure that the second switching transistor M2' and the fourth switching transistor M2 are both turned off or turned on when a same drive signal is input.

In an embodiment, a size of the first switching transistor M1' is X times a size of the third switching transistor M1, a size of the second switching transistor M2' is Y times a size of the fourth switching transistor M2, and both X and Y are greater than 1. Because a larger size of a switching transistor indicates smaller impedance and a better heat dissipation effect, a first switching transistor M1' and a second switching transistor M2' of sizes as large as possible can be selected. In addition, the first switching transistor M1' and the second switching transistor M2' may be selected based on an actual signal frequency. Because a smaller signal frequency indicates larger impedance, a first switching transistor M1' of a relatively large size and a second switching transistor M2' of a relatively large size can be selected. Because a larger signal frequency indicates smaller impedance, a first switching transistor M1' of a relatively small size and a second switching transistor MT of a relatively small size can be selected.

In an embodiment, the first capacitor C1' may be disposed inside the power supply chip, thereby facilitating integration of the power supply chip and reducing power consumption of the circuit. Alternatively, the first capacitor C1' may be disposed outside the power supply chip, thereby facilitating selection of a capacitor with a larger capacitance, and achieving a better effect of improving stability of the circuit. The first capacitor C1' may be disposed adjacent to the second capacitor. In addition, the first switching transistor M1' and the second switching transistor M2' may be disposed outside the power supply chip, or may be disposed inside the power supply chip.

In an embodiment, the first switching transistor M1', the second switching transistor M2', the third switching transistor M1, or the fourth switching transistor M2 includes but is not limited to a bipolar transistor (such as BJT), a metal-oxide semiconductor field-effect transistor (such as MOSFET), or various III-V compound semiconductors (such as SiGe, GaAs, InP, and GaN). The first capacitor C1' or the second capacitor C1 may include but is not limited to a ceramic capacitor, a tantalum capacitor, or an electrolytic capacitor.

In this embodiment of this application, the charging charges of the second capacitor are balanced by using the ideal charge storage capacity of the first capacitor, so that stability of the voltage difference between the two terminals of the bootstrap capacitor is improved, and a problem that the voltage difference between the two terminals of the bootstrap capacitor is unstable is fundamentally resolved, instead of only alleviate an impact caused by mutual feed-through between all channels. This improves dynamic performance of a circuit system. In addition, only two switching transistors and one capacitor need to be added on a basis of the power supply chip, a small quantity of elements are added, and a layout location of the added element may be selected to be inside the power supply chip or outside the power supply chip according to an actual situation. Because a direct current cannot flow through the added element, the added element does not form a direct current path, and no additional static power consumption is added.

An embodiment of this application may be applied to an apparatus. The apparatus may be a wireless communications system. The power supply circuit may be a multi-phase modulation power supply system module, for example, an envelope tracking power supply providing a multi-phase modulation structure for a power amplifier module of the wireless communications system.

The objectives, technical solutions, and beneficial effects of the present application have been described in more detail with reference to specific embodiments. Any modification, equivalent replacement, or improvement made without departing from the spirit and principle of the present application shall fall within the protection scope of the present application.

What is claimed is:

1. A power supply circuit, comprising:
a plurality of channels, and at least one channel of the plurality of channels comprising:
a first switching transistor,
a second switching transistor,
a third switching transistor,
a fourth switching transistor,
a first capacitor, and
a second capacitor; wherein one terminal of the first capacitor is connected to one terminal of the second capacitor, the other terminal of the first capacitor is separately connected to a first electrode of the first switching transistor and a first electrode of the second switching transistor, a second electrode of the first switching transistor is connected to a second electrode of the third switching transistor, a second electrode of the second switching transistor is connected to a second electrode of the fourth switching transistor, a third electrode of the first switching transistor is connected to an output node, and a third electrode of the second switching transistor is grounded.

2. The circuit according to claim 1, wherein a capacitance of the first capacitor is N times a capacitance of the second capacitor, and N is greater than 1.

3. The circuit according to claim 1, wherein a type of the first switching transistor is the same as a type of the third switching transistor, and a type of the second switching transistor is the same as a type of the fourth switching transistor.

4. The circuit according to claim 3, wherein a size of the first switching transistor is X times a size of the third switching transistor, a size of the second switching transistor is Y times a size of the fourth switching transistor, and both X and Y are greater than 1.

5. The circuit according to claim 1, wherein the first switching transistor, the second switching transistor, the third switching transistor, or the fourth switching transistor comprises a bipolar transistor, a metal-oxide semiconductor field-effect transistor, or a compound semiconductor.

6. The circuit according to claim 1, wherein the first capacitor or the second capacitor comprises a ceramic capacitor, a tantalum capacitor, or an electrolytic capacitor.

7. The circuit according to claim 1, wherein the power supply circuit is a multi-phase modulation power supply circuit.

8. The circuit according to claim 1, wherein the third switching transistor, the fourth switching transistor, and the second capacitor are included in a power supply chip.

9. The circuit according to claim 8, wherein the first capacitor is disposed outside the power supply chip and is adjacent to the second capacitor.

10. An apparatus, comprising:
a power supply circuit; and
a power amplifier, wherein the power supply circuit is configured to provide power supply for the power amplifier, and the power supply circuit comprises:
a first switching transistor,
a second switching transistor,
a third switching transistor,
a fourth switching transistor,
a first capacitor, and
a second capacitor; wherein one terminal of the first capacitor is connected to one terminal of the second capacitor, the other terminal of the first capacitor is separately connected to a first electrode of the first switching transistor and a first electrode of the second switching transistor, a second electrode of the first switching transistor is connected to a second electrode of the third switching transistor, a second electrode of the second switching transistor is connected to a second electrode of the fourth switching transistor, a third electrode of the first switching transistor is connected to an output node, and a third electrode of the second switching transistor is grounded.

11. The apparatus according to claim 10, wherein the third switching transistor, the fourth switching transistor, and the second capacitor are included in a power supply chip.

12. The apparatus according to claim 11, wherein the first capacitor is disposed outside the power supply chip and is adjacent to the second capacitor.

13. The apparatus according to claim 10, wherein the power supply circuit is an envelope tracking power supply circuit.

14. The apparatus according to claim 13, wherein the envelope tracking power supply circuit providing a multi-phase modulation structure.

15. The apparatus according to claim 10, wherein a capacitance of the first capacitor is N times a capacitance of the second capacitor, and N is greater than 1.

16. The apparatus according to claim 10, wherein a type of the first switching transistor is the same as a type of the third switching transistor, and a type of the second switching transistor is the same as a type of the fourth switching transistor.

17. The apparatus according to claim 10, wherein a size of the first switching transistor is X times a size of the third switching transistor, a size of the second switching transistor is Y times a size of the fourth switching transistor, and both X and Y are greater than 1.

18. The apparatus according to claim 10, wherein the apparatus is a wireless communications system.

* * * * *